United States Patent [19]
Kondo et al.

[11] Patent Number: 6,043,986
[45] Date of Patent: *Mar. 28, 2000

[54] PRINTED CIRCUIT BOARD HAVING A PLURALITY OF VIA-HOLES

[75] Inventors: Koji Kondo, Toyohashi; Kiyoshi Nakakuki, Nagoya; Hideki Kabune, Chiryu; Hajime Kumabe, Anjo, all of Japan

[73] Assignee: Nippondenso Co., Ltd., Kariya, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/715,515

[22] Filed: Sep. 18, 1996

[30] Foreign Application Priority Data

Sep. 19, 1995 [JP] Japan .................................. 7-266213
Aug. 23, 1996 [JP] Japan .................................. 8-241369

[51] Int. Cl.⁷ ....................................................... H05K 7/20
[52] U.S. Cl. .................................................. 361/720; 174/252
[58] Field of Search .................................. 174/252, 266; 361/704–707, 717–721

[56] References Cited

U.S. PATENT DOCUMENTS

| | | | |
|---|---|---|---|
| 4,689,442 | 8/1987 | Ozatti | 361/720 |
| 5,113,315 | 5/1992 | Li et al. | 361/705 |
| 5,258,887 | 11/1993 | Fortune | 361/720 |
| 5,513,070 | 4/1996 | Xie et al. | 361/720 |

FOREIGN PATENT DOCUMENTS

| | | | |
|---|---|---|---|
| 62-42273 | 3/1987 | Japan . | |
| 62-257786 | 11/1987 | Japan . | |
| 2058358 | 2/1990 | Japan | 361/719 |
| 2-154919 | 6/1990 | Japan . | |
| 4-279097 | 10/1992 | Japan . | |
| 4279097 | 10/1992 | Japan | 361/720 |

Primary Examiner—Gregory Thompson
Attorney, Agent, or Firm—Pillsbury Madison & Sutro LLP

[57] ABSTRACT

A printed circuit board, having a plurality of via-holes provided in an area where circuit elements are arranged, includes a thermally conductive material having thermally good conductivity, for example copper, and the thermally good conductive material is formed in an inner wall of each of the plurality of via-holes. Each of the plurality of via-holes has, for example, a circular shape, and is arranged in the form of hexagonal or triangular lattice in the area where the circuit elements are arranged. Further, preferably, a diameter of each of the plurality of via-holes is equal to a hole pitch having an allowance ±0.3 mm. According to above structure, it is possible to provide a plurality of via-holes per unit area with high density on the printed circuit board and to improve the thermal conductivity of the printed circuit board by effectively radiating the heat generated from the circuit elements.

2 Claims, 6 Drawing Sheets

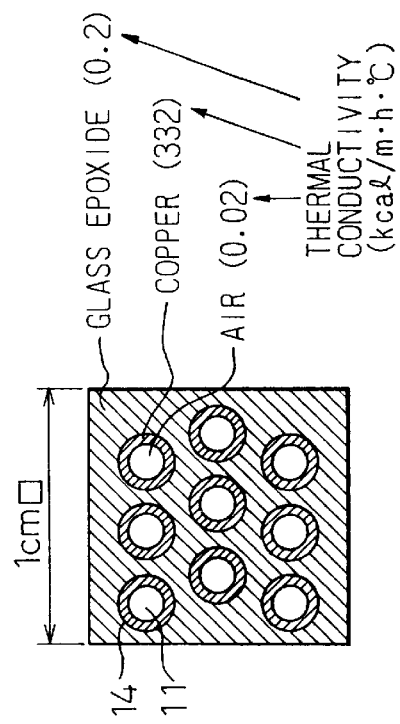
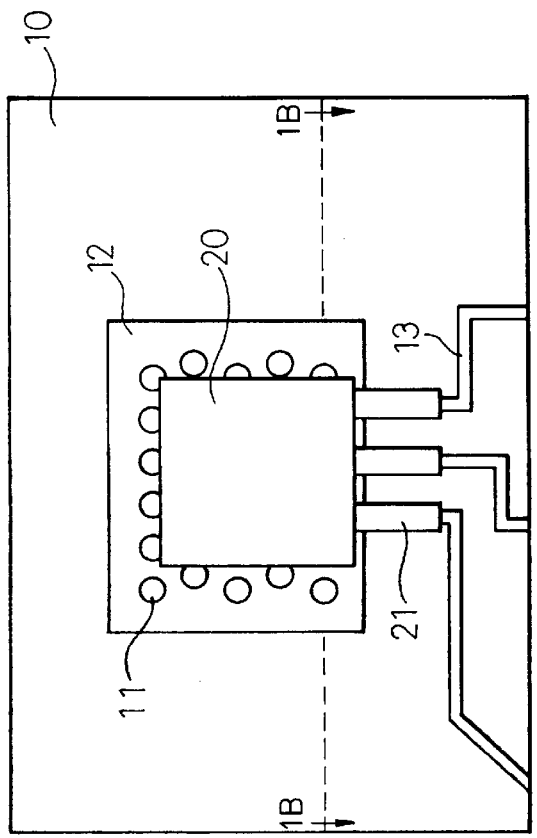
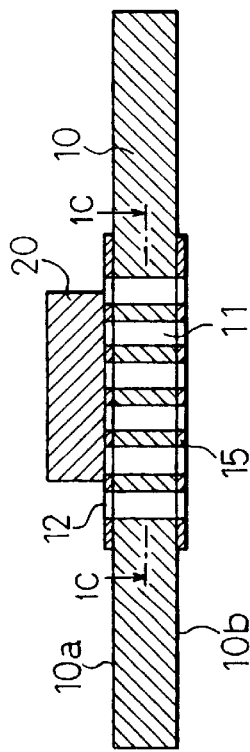

//  6,043,986

PRINTED CIRCUIT BOARD HAVING A PLURALITY OF VIA-HOLES

BACKGROUND OF THE INVENTION

1. Field of the Invention

The present invention relates to a printed circuit board, and more particularly, it relates to a printed circuit board having a plurality of via-holes which are provided for effectively radiating the heat generated from circuit elements which are mounted on the printed circuit board.

2. Description of the Related Art

Recent technology for printed circuit boards more and more tends to prepare semiconductor elements with high integration and to mount them with high density on printed circuit boards. In accordance with this tendency, it is strongly required to cool elements or to radiate heat generated from elements mounted on the printed circuit boards.

In actuality, a cooling apparatus is provided for a large scale electronics apparatus (for example, a large scale computer) in order to cool circuit elements. However, in the case of electronic apparatuses which are required to be small in size, it is difficult to use such a cooling apparatus because of the high cost and large size thereof. Accordingly, conventionally, in such a small scale electronics apparatus, a heat sink, for example, a metal plate, has been used for radiating the heat generated from circuit elements (i.e., heater elements) in stead of the cooling apparatus.

In general, the printed circuit board is made by a resin, for example, an epoxide, and this material has low thermal conductivity so that the radiation of the heat becomes worse. Accordingly, it is necessary to mount a heat sink which has a good characteristic for radiating the heat because of the high thermal conductivity thereof.

On the other hand, the Japanese Unexamined Patent Publication No. 62-257786 and the Japanese U.M. Publication No. 62-42273 disclose another cooling method for a purpose of low cost and small size. According to this method, the heat sink is not provided, and a plurality of through-holes (which are called "thermally conductive through hole" or simply "thermal-via") each containing a thermally conductive material, for example, a metal, are provided on the printed circuit board in order to realize good thermal conductivity in the whole printed circuit board.

Further, in the former document (JPP-62-257786), the through-holes are provided so as to penetrate the printed circuit board by using a drill, and copper (Cu)-plating is provided on a side surface of each through-hole. According to this structure, since the air is filled within a space provided by the through-hole, the thermal conductivity becomes extremely worse. However, since the Cu-plating is provided on the side surface of each through-hole, it is possible to improve the thermal conductivity of the printed circuit board as the whole.

However, although the above method is preferable for the purpose of low cost and small size, there are some limitations, for example, the density of the through-hole and the restriction of a size of hole (i.e., diameter thereof) so that it is very difficult to obtain sufficient radiation of the heat. Accordingly, there is a problem which it is very difficult to utilize this method to elements which radiate large amount of heat.

Still further, in the latter document (JUMP-62-42273), although this discloses the thermally conductive through-holes, it does not disclose a concrete method for improving the thermal conductivity.

SUMMARY OF THE INVENTION

Therefore, the present invention aims to provide an improved printed circuit board which can raise the density of the via-holes per unit area on the printed circuit board so that it is possible to improve the thermal conductivity of the printed circuit board and to effectively radiate the heat generated by the circuit elements.

In accordance with the present invention, there is provided a printed circuit board having a plurality of via-holes provided for an area where circuit elements are arranged, including: a thermally conductive material having thermally good conductivity and being formed in an inner wall of each of the plurality of via-holes; and the plurality of via-holes being arranged in the form of hexagonal or triangular lattice in the area where the circuit elements are arranged.

In a preferred embodiment, the plurality of via-holes are arranged in the form of regular hexagonal or equilaterally triangular lattice in the area where the circuit elements are arranged.

In another preferred embodiment, a thermally conductive film having thermally good conductivity is formed on a surface where the plurality of via-holes are arranged.

In still another preferred embodiment, the thermally conductive film is formed of at least one of a metal-plated coat, a resin-paste including powdered metal, or a conductive adhesive.

In still another preferred embodiment, the thermally conductive film is formed of at least one of a copper plate coat, a nickel plate coat, or a resin-paste including copper paste.

In still another preferred embodiment, each of the plurality of via-holes has a circular shape in its sectional view.

In still another preferred embodiment, a diameter of each of the plurality of via-holes is equal to a hole pitch having an allowance ±0.3 mm.

In still another preferred embodiment, a diameter of each of the plurality of via-holes is substantially equal to a hole pitch.

In still another preferred embodiment, the plurality of via-holes are provided so as not to penetrate the printed circuit board.

In still another preferred embodiment, the plurality of via-hole 11 are provided for the inside of the printed circuit board.

BRIEF EXPLANATION OF THE DRAWINGS

In the drawings:

FIGS. 1A to 1C show a first embodiment of the present invention, FIG. 1A is a plan view, FIG. 1B is a sectional view of FIG. 1A and FIG. 1C is a partially sectional view along 1C—1C' of FIG. 1B;

FIG. 4 shows arrangement of via-holes in the form of a square lattice, FIG. 5 shows arrangement of via-holes in the form of a triangular lattice, and FIG. 6 shows arrangement of via-holes in the form of a hexagonal lattice;

DESCRIPTION OF THE PREFERRED EMBODIMENTS

Figure 2:
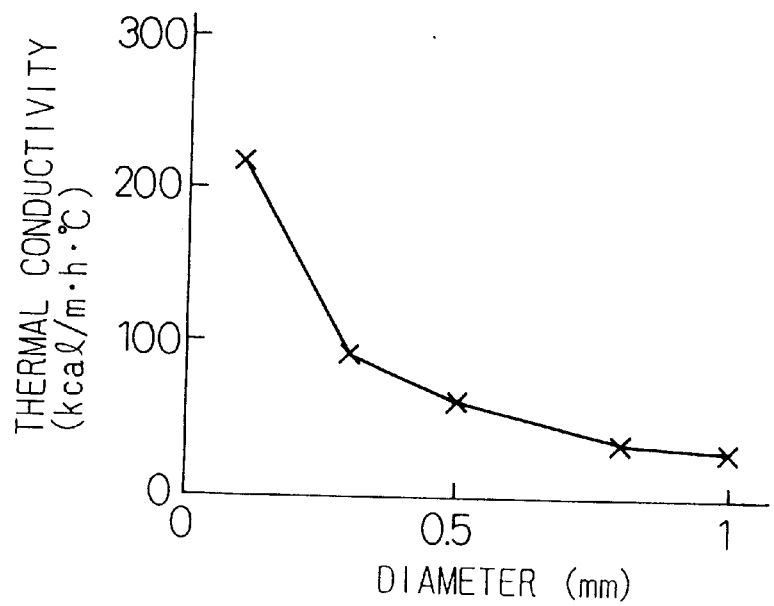
FIG. 2 is a graph for explaining the relationship between the thermal conductivity and the diameter of the via-hole.

The preferred embodiments of the present invention will be explained in detail with reference to the attached drawings.

A first embodiment of the present invention is explained with reference to FIGS. 1 to 6 below.

FIGS. 1A to 1C show the first embodiment of the present invention. FIG. 1A is the plan view, FIG. 1B is the sectional view of FIG. 1A and FIG. 1C is the partially sectional view of FIG. 1B. In these drawings, reference number 10 denotes the printed circuit board, 11 thermally conductive via-holes, 12 and 15 copper foil plane patterns, 13 circuit patterns, 14 a copper foil, 20 a circuit element (this corresponds to the heater element), and 21 connection terminals.

The heater element 20 is mounted on the printed circuit board 10 and formed by, for example, a power transistor, a logic IC, etc. The heater element 20 radiates heat from a back surface thereof, and this heat is propagated (radiated) to peripheral portions 11, 12 and 15 in order to cool the heater element 20. In general, the printed circuit board 10 is formed of glass epoxide.

As shown in FIG. 1B, a plurality of thermally conductive via-holes 11 (below, via-holes) are provided and penetrate the printed circuit board 10 from a upper surface 10a to a lower surface 10b. In FIG. 1C, this area shows 1 cm□ (cm²) along 1C—1C' of FIG. 1B. Each via-hole 11 has the copper foil 14 in an inner wall thereof. In general, the copper foil 14 has the thermally good conductivity, and electrically connects between the copper foil plane pattern 12 of the upper surface 10a and the copper foil plane pattern 15 of the lower surface 10b. Both of the copper foil patterns 12 and 15 have thermally good conductivity.

The heater element 20 is fixed on the copper foil plane pattern 12 by using a solder or paste, and the connection terminals 21 thereof are electrically connected to the corresponding circuit pattern 13.

In this structure, the heat generated from the heater element 20 is effectively propagated on the copper foil plane pattern 12 and radiated therefrom. Further, the heat generated from the heater element 20 is effectively propagated to the copper foil plane pattern 15 through the via-holes 11 and radiated therefrom. The heat is easily propagated through the via-holes 11 since they have copper foil 14 in the inner wall thereof.

In the printed circuit board 10, the thermal conductivity of the inner wall of each via-hole 11 becomes high since the copper foil (thermal conductivity 332 kcal/m·h·° C.) is coated. On the other hand, the thermal conductivity of an inner portion of the via-hole 11 becomes low (worse) since the air (thermal conductivity 0.02 kcal/m·h·° C.) is filled so that it cannot be expected to provide thermally good conductivity. Further, other portions of the printed circuit board 10 are formed by the glass epoxide (thermal conductivity 0.2 kcal/m·h·° C.).

FIG. 2 is a graph for explaining the relationship between the thermal conductivity and the diameter of the via-hole. The ordinate denotes the thermal conductivity and the abscissa denotes the diameter of the via-hole. This graph explains that, when the thickness of the Cu-plate is 30 μm, the thermal conductivity of a square area which contacts outside of the via-hole is calculated in accordance with change of the diameter of the via-hole.

As is obvious from the graph, the smaller the diameter of the via-hole 11, the higher (better) the thermal conductivity of the printed circuit board 10. This is because, the smaller the diameter of the via-hole 11, the less the volume of the air within the via-hole, so that a ratio between the volume of the air and Cu-plate portion is changed so as to increase the ratio of the Cu-plate portion. Accordingly, the smaller the diameter of the via-hole 11, the more advantageous the thermal conductivity of the printed circuit board 10.

Figure 3:
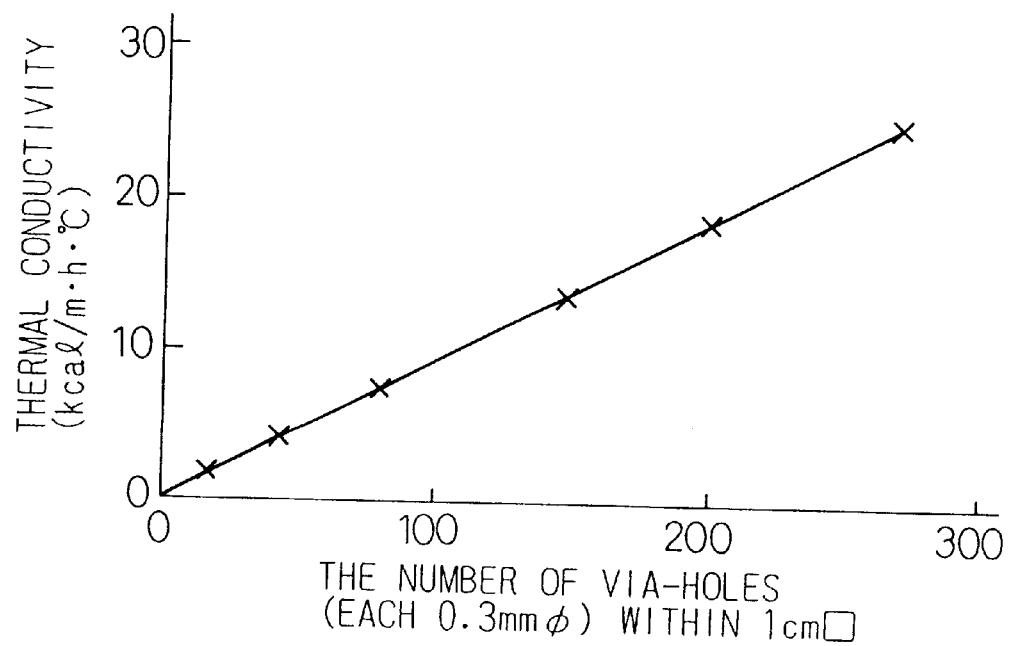
FIG. 3 is a graph for explaining the relationship between the thermal conductivity and the number of via-holes.

FIG. 3 is a graph for explaining the relationship between the thermal conductivity and the number of via-holes. The ordinate denotes the thermal conductivity and the abscissa denotes the number of the via-holes. In general, when providing holes on the printed circuit board made by the glass epoxide by using a drill, the minimum diameter of the via-hole 11 is 0.3 mm. Accordingly, the abscissa explains the number of via-holes, each having the diameter 0.3 mmφ, in the area of 1 cm□ (1 cm²).

As is obvious from the graph, the greater the number of the via-holes 11, the higher the thermal conductivity. This is because the greater the number of the via-holes 11, the larger the effect of the thermal conductivity of the copper foil 14 provided on the inner wall of the via-hole 11. As a result, it is possible to improve the thermal conductivity of the printed circuit board as a whole. Further, according to the data shown in FIG. 3, it is possible to achieve the same thermal conductivity as that of an alumina board when there are about two hundred via-holes per 1 cm² (when each diameter of the via-hole is 0.3 mmφ). This means that the via-holes each having the diameter 0.3 mmφ are provided for every pitch of 0.7 mm on the printed circuit board 10.

Therefore, it is important that the via-holes are provided at a high density in order to raise the thermal conductivity. How to provide the via-holes at a high density will be explained in detail with reference to the drawings.

Figure 4:
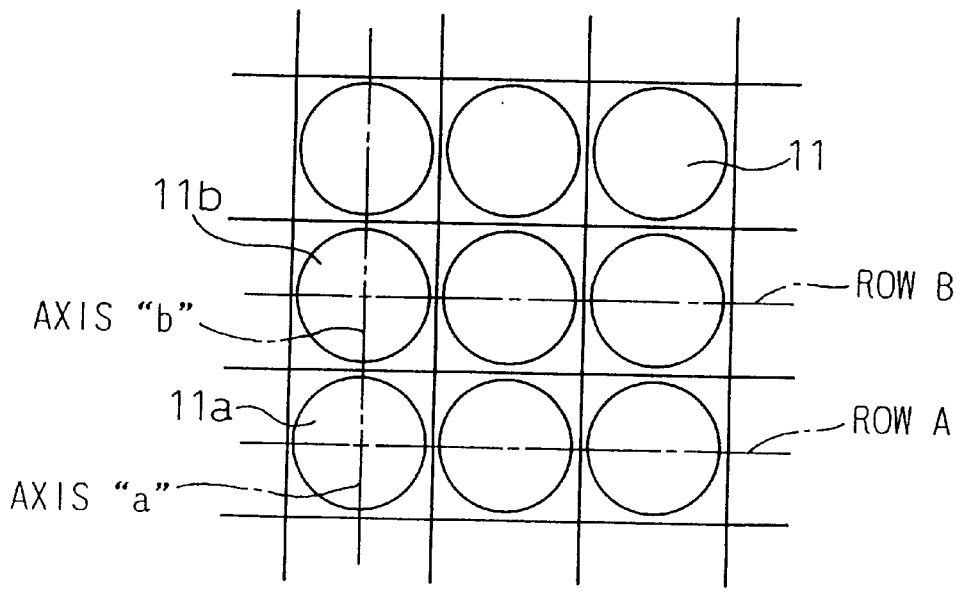
FIGS. 4 to 6 are views for explaining various arrangement of via-holes for obtaining high density.
Figure 5:
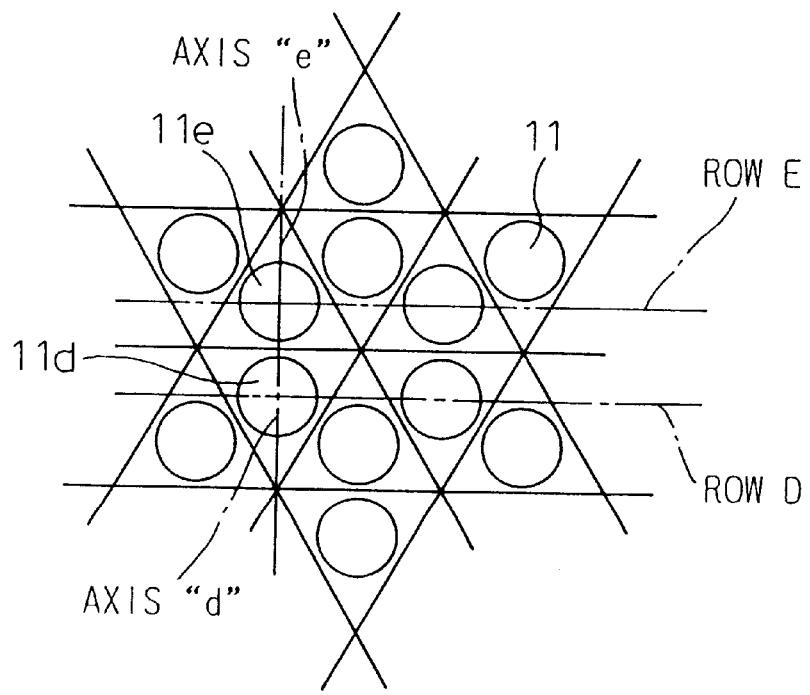
Figure 6:
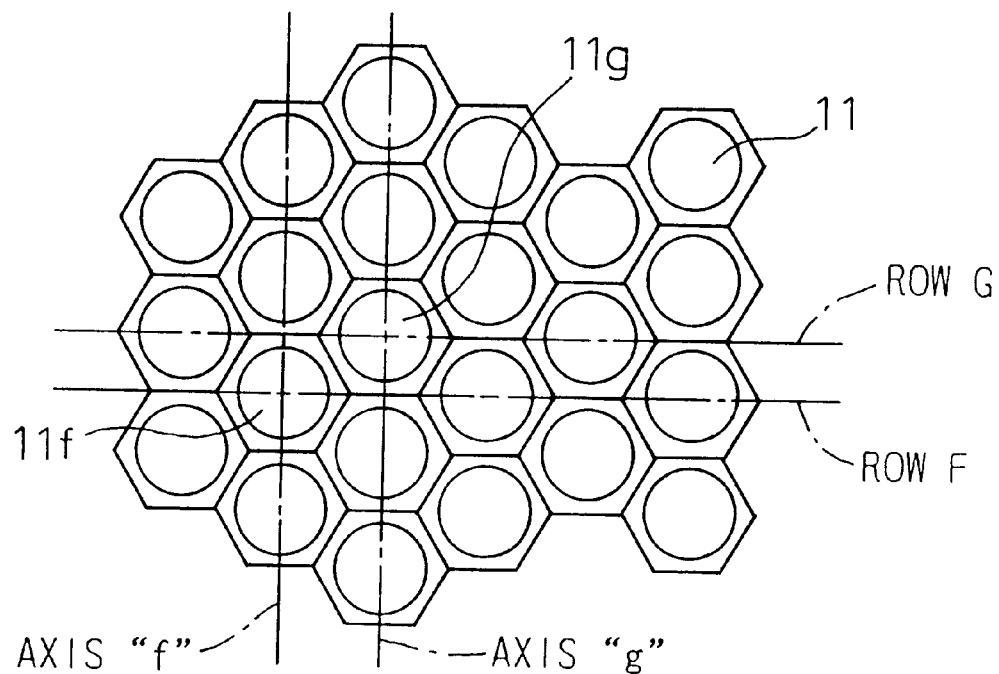

FIGS. 4 to 6 are views for explaining various arrangements of via-holes for obtaining high density. FIG. 4 shows an arrangement of via-holes in the form of square lattice, FIG. 5 shows an arrangement of via-holes in the form of triangular lattice, and FIG. 6 shows an arrangement of via-holes in the form of hexagonal lattice.

As shown by these drawings, there are three kinds of representative arrangements of the via-holes for obtaining high density. That is, in the first arrangement shown in FIG. 4, the via-holes are arranged in the form of a square lattice. In the second arrangement shown in FIG. 5, the via-holes are arranged in the form of a triangular lattice. In the third arrangement shown in FIG. 6, the via-hole are arranged in the form of a hexagonal lattice.

The relationship between the number of via-holes and the thermal conductivity for three kinds of arrangements is explained in detail below. In this case, the diameter of each via-hole is set to 0.6 mmφ, and the hole pitch between the adjacent via-holes is set to 1.2 mm. Further, the via-holes are provided within the area 10 mm□ (mm²).

1) In the form of the square lattice,
   the maximum number of via-holes is 69, and
   the thermal conductivity was 13 (kcal/m·h·° C.).
2) In the form of the triangular lattice,
   the maximum number of via-holes is 53, and
   the thermal conductivity was 10 (kcal/m·h·° C.).

3) In the form of the hexagonal lattice,
the maximum number of via-holes is 80, and
the thermal conductivity was 15 (kcal/m·h·° C.).

As is obvious from the above data, when the via-holes 11 are arranged in the form of a square lattice, the number of via-holes becomes sixty-nine at a maximum, and the thermal conductivity becomes 13 (kcal/m·h·° C.). On the other hand, when the via-holes 11 are arranged in the form of a triangular lattice, the number of via-holes becomes only fifty-three, and the thermal conductivity becomes 10 (kcal/m·h·° C.). However, when the via-holes 11 are arranged in the form of the hexagonal lattice, the number of via-holes becomes eighty at a maximum, and the thermal conductivity becomes 15 (kcal/m·h·° C.). Therefore, the third arrangement, i.e., the arrangement in the form of the hexagon-like lattice, gives the best result. This reason is explained in detail below.

In the structure of FIG. 4, regarding any via-hole 11a on a row A and an adjacent via-hole 11b on a row B, an axis "a", which passes through a center of the via-hole 11a and is perpendicular to the row A, becomes the same line as the axis "b" which passes through the center of the via-hole 11b and is perpendicular to the row B. In this case, since the number of the adjacent via-holes are four, it is difficult to arrange the via-holes 11 at a high density.

In the structure of FIG. 5, regarding any via-hole 11d on the row D and the adjacent via-hole 11e on the row E, the axis "d", which passes through the center of the via-hole 11d and is perpendicular to the row D, becomes the same line as the axis "e" which passes through the center of the via-hole 11e and is perpendicular to the row E. In this case, since the number of the adjacent via-holes are three, it is more difficult to arrange the via-holes 11 with high density.

In the case of FIG. 6, regarding any via-hole 11f on the row F and the adjacent via-hole 11g on the row G, the axis "f", which passes through the center of the via-hole 11f and is perpendicular to the row F, is not the same line as the axis "g" which passes through the center of the via-hole 11g and is perpendicular to the row G. That is, axis "f" does not coincide with the axis "g". In this case, since the number of the adjacent via-holes are six, it is possible to arrange the via-holes 11 with high density.

Therefore, when the sectional shape of the via-hole 11 is circular and the number of via-holes is constant, the arrangement of via-holes in the form of the hexagon-like lattice is the most preferable from a viewpoint of density of the via-holes. Further, in general, the mechanical strength of the printed circuit board 10 becomes lower when the number of via-holes is increased. However, the arrangement of via-holes in the form of the hexagonal lattice is also preferable from the viewpoint of the mechanical strength of the printed circuit board 10.

In this case, it is necessary to provide a hole pitch between the via-holes as large as possible from the viewpoint of the mechanical strength. Further, as explained above, it is necessary to provide as many as possible via-holes in order to obtain the maximum thermal conductivity. Still further, when considering the drilling cost for the via-holes, it is advantageous if the diameters of the via-holes are as large as possible and the number of via-holes is as small as possible. Accordingly, the arrangement of via-holes in the form of the hexagonal lattice is the most preferable from these viewpoints.

Next, a representative manufacturing method for the via-holes will be explained in detail below.

When the printed circuit board 10 is a double-face type (i.e., a circuit pattern is provided on the front and on the back surfaces), copper laminated board is used. The via-holes are provided on the printed circuit board by using an NC (numerical control) drill in such a way that there are always adjacent six via-holes which exist in the shortest distance.

Next, the via-holes 11 are plated with the copper so that the copper foil 14 is coated in each inner wall thereof. Further, the copper foil patterns 12 and 15 having any desired pattern are formed on the upper and lower surfaces 10a and 10b by using an etching process.

After these processes, solder resist is formed on areas where the solder is not required. Then, the printed circuit board is completed after the outside thereof is shaped. Further, the circuit element 20 is mounted on the printed circuit board 10 by using the solder or paste.

In this embodiment, although the copper foil 14 is provided for the inner wall of the via-hole 11, the present invention is not limited in this embodiment. That is, other conductive materials, for example, nickel, can be used for coating the inner wall of the via-hole 11. Further, a resin paste including powdered metal (for example, powdered copper) or a conductive adhesive can be used for coating the inner wall of the via-hole 11.

Further, in this embodiment, although no particular material is filled within the via-hole except for the air, it is possible to fill the particular material having the thermally good conductivity higher than the air, for example, solder, resin, etc., within the via-hole 11. Still further, if copper, which is the same material as the copper foil 14 coated to the inner wall, is filled within the via-hole 11, it is possible to realize an effective thermal conductivity of the via-hole 11.

In this embodiment, although the copper foil pattern 12 is provided on the upper surface 10a and the copper foil pattern 15 is provided on the lower surface 10b, it is possible to provide only a copper foil pattern 12 on the upper surface 10a without the copper foil pattern 15 on the lower surface 10b.

Figure 10:
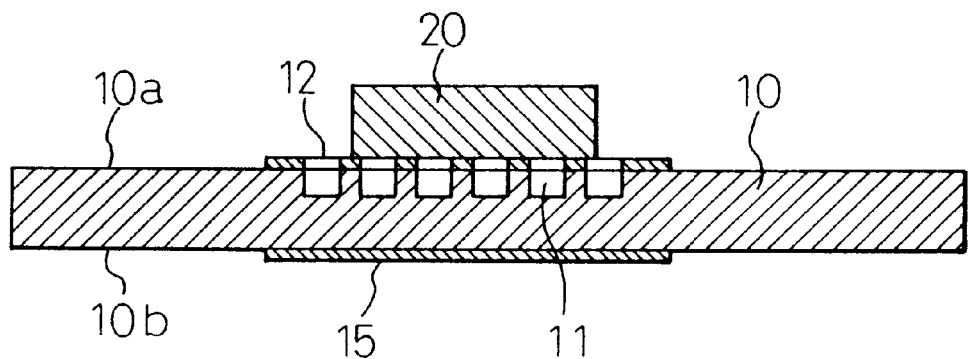
FIGS. 10 and 11 are sectional views for explaining another example of via-holes according to the present invention.
Figure 11:
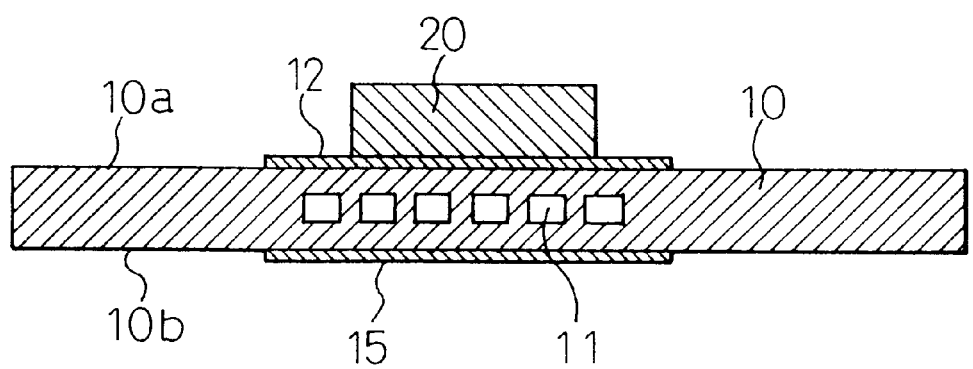

Further, in this embodiment, although the via-holes are provided so as to penetrate from the upper surface 10a to the lower surface 10b, it is not always necessary to penetrate the printed circuit board 10 as explained in FIGS. 10 and 11.

A second embodiment of the present invention is explained with reference to FIG. 7 below.

In the first embodiment, all via-holes 11 have the same diameter and a circular shape in a sectional view. In the second embodiment, the via-holes are formed with a hexagonal shape in a sectional view as explained below.

Figure 7:
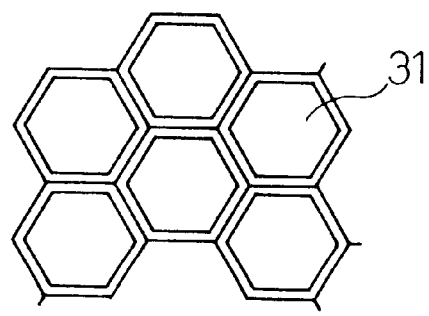
FIG. 7 shows hexagonal via-holes arranged in the form of hexagonal lattice.

FIG. 7 shows via-holes each having a hexagonal shape arranged in the form of the same hexagonal lattice. In the first embodiment, since the via-hole has a circular shape in the sectional view, it could be formed by using the drill. In this embodiment, since the via-hole 31 has a hexagonal shape, it is formed by using, for example, a photoresist. Since the via-holes 31 are formed in a hexagonal shape in the sectional view, it is possible to improve the thermal conductivity of the printed circuit board and to have sufficient mechanical intensity because of the honeycomb structure. As a result, it is possible to obtain the same effect as the first embodiment.

Figure 8:
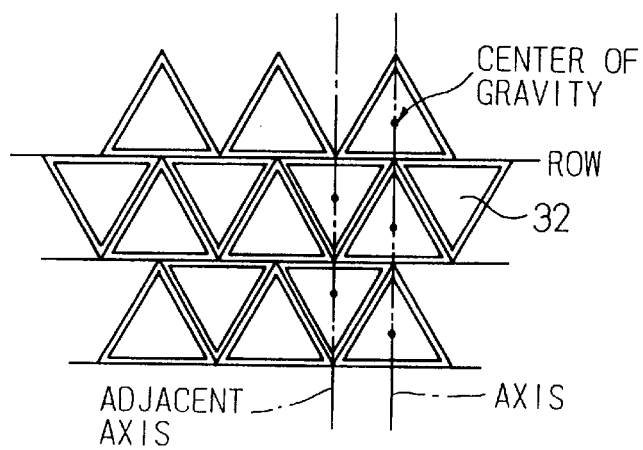
FIG. 8 shows triangular via-holes arranged in the form of triangular lattice.

FIG. 8 shows via-holes each having a triangular shape arranged in the form of a triangular lattice. In this embodiment, the via-holes 32 are formed in a triangular shape. The axis, which is perpendicular to the row and passes through the center of gravity of the via-hole 32, does not coincide with another axis passing through the center of gravity of the adjacent left and right via-hole.

Accordingly, it is possible to provide the via-holes with higher density compared to the conventional art and to improve the thermal conductivity of the printed circuit board 10. In this case, as well as FIG. 7, the via-holes are formed by using, for example, a photoresist.

In this embodiment, although the via-holes are formed in a hexagonal shape or a triangular shape, the present invention is not limited to the above shapes. That is, any shape can be used as the via-hole when it satisfies the following conditions. That is, regarding any via-holes adjacent each other and belonging to different rows, the axis, which is perpendicular to the row and passes through the center (or center of gravity) of the via-hole, does not coincide with another axis of the adjacent via-hole (i.e., the axis is away from the axis of the adjacent via-hole).

A third embodiment of the present invention is explained with reference to FIG. 9 below.

Figure 9:
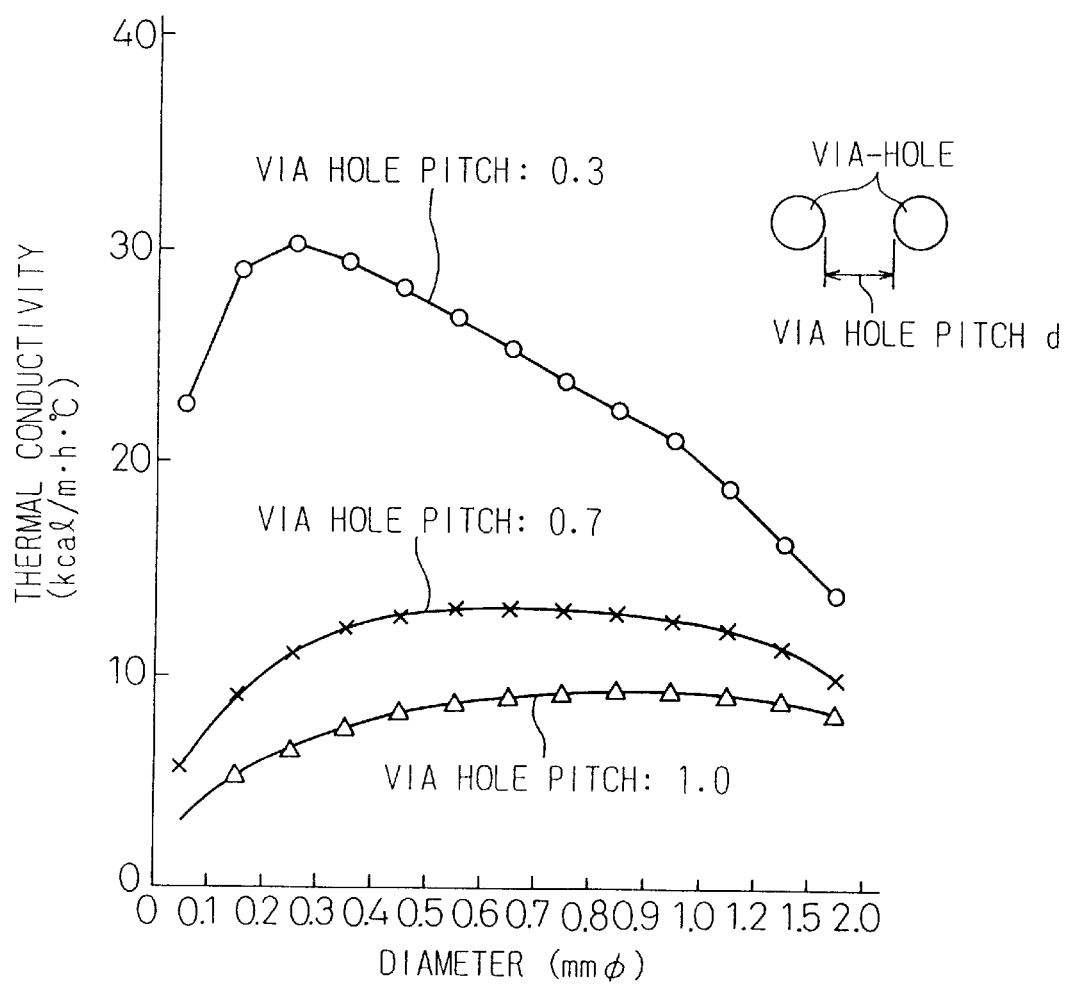
FIG. 9 is a graph for explaining the relationship between the thermal conductivity and the hole pitch between adjacent via-holes in each diameter.

FIG. 9 is a graph for explaining the relationship between the thermal conductivity and the via-hole pitch between adjacent via-holes of each diameter. In FIG. 9, the mark "○" is in the case of the via-hole pitch 0.3, the mark "x" is in the case of the via-hole pitch 0.7 and the mark "Δ" is in the case of the via-hole pitch 1.0. In this case, the above via-hole pitch is defined by a distance "d·", i.e., the distance between adjacent via-holes as shown in the drawing.

In the first and second embodiments, forming the via-holes with high density in order to raise the thermal conductivity was explained. In this embodiment, the relationship between the diameter of via-hole and the hole pitch "d" will be explained with reference to the graph in order to obtain the optimum thermal conductivity.

As is obvious from the graph, the smaller the hole pitch, the higher the thermal conductivity. Further, for each curve for a hole pitch, when the diameter of the via-hole is equal to or approximately equal to the hole pitch, the thermal conductivity is the highest. Still further, the range of the peak value for the highest conductivity lies under about ±0.3 mm for each diameter. That is, an optimum diameter of the via-hole which can obtain the thermally good conductivity exists in the range of the corresponding hole pitch and a predetermined allowance. In this case, the best allowance of the hole pitch is about ±0.3 mm.

A fourth embodiment of the present invention is explained with reference to FIGS. 10 and 11 below.

FIGS. 10 and 11 are sectional views for explaining another example of the via-holes. In FIG. 10, as is obvious from comparison with the via-hole of FIG. 1B, in this embodiment, the via-hole does not penetrate through the printed circuit board 10, and the depth of the via-hole 11 is determined in accordance with the thermal conductivity of the printed circuit board 10. According to this structure, it is possible to optionally determine the shape of the copper foil patterns 12 and 15 when designing the circuit.

In FIG. 11, as is obvious from comparison with the via-hole of FIG. 10, in this embodiment, the via-hole 11 is formed inside the printed circuit board 10. These via-holes can be formed by preparing two substrates each having a plurality of half via-holes like FIG. 10 and laminating these substrates together so as to form the via-holes 11 shown in FIG. 11. According to this structure, it is possible to optionally determine the shape of copper foil patterns 12 and 15 when designing the circuit as well as the structure of FIG. 10.

We claims:

1. A printed circuit board arrangement, comprising:

a circuit board element having a plurality of via-holes therein provided for an area where circuit elements are to be arranged; and a thermally conductive material formed on an inner wall of each of the plurality of via-holes, the plurality of via-holes being arranged in a form of a lattice, wherein:
each of the via-holes, exept outer via-holes, has only six adjacent via-holes arranged in a form of a hexagon lattice,
a cross-sectional area of each of the via-holes, in a plane substantially perpendicular to a central axis of each of the via-holes, has a circular shape, a diameter of each of the plurality of via-holes is equal to a hole pitch having an allowance of ±0.3 mm.

2. A printed circuit board arrangement as claimed in claim 1, wherein distances, between each one of the via-holes and a corresponding six adjacent ones of the via-holes are substantially equal.

* * * * *